(12) United States Patent
Lee et al.

(10) Patent No.: US 6,858,077 B2
(45) Date of Patent: Feb. 22, 2005

(54) SINGLE CRYSTALLINE SILICON WAFER, INGOT, AND PRODUCING METHOD THEREOF

(75) Inventors: Hong-Woo Lee, Gumi-shi (KR); Joon-Young Choi, Chilgok-gun (KR); Hyon-Jong Cho, Bucheon-shi (KR); Hak-Do Yoo, Seoul (KR)

(73) Assignee: Siltron Inc., Gumi-shi (KR)

( * ) Notice: Subject to any disclaimer, the term of this patent is extended or adjusted under 35 U.S.C. 154(b) by 280 days.

(21) Appl. No.: 10/291,640

(22) Filed: Nov. 12, 2002

(65) Prior Publication Data

US 2003/0068501 A1 Apr. 10, 2003

Related U.S. Application Data

(62) Division of application No. 09/742,215, filed on Dec. 22, 2000, now Pat. No. 6,521,316.

(30) Foreign Application Priority Data

Sep. 4, 2000 (KR) ......................................... 2000-52205

(51) Int. Cl.[7] .............................................. C30B 30/04
(52) U.S. Cl. .............................. 117/13; 117/73; 117/74
(58) Field of Search ............................. 117/13, 20, 73, 117/74

(56) References Cited

U.S. PATENT DOCUMENTS

| | | | | |
|---|---|---|---|---|
| 5,487,354 A | * | 1/1996 | Von Ammon et al. ........ 117/13 |
| 5,919,302 A | | 7/1999 | Falster et al. | |
| 5,954,873 A | * | 9/1999 | Hourai et al. .................. 117/13 |
| 5,968,264 A | * | 10/1999 | Iida et al. ...................... 117/30 |
| 6,048,395 A | * | 4/2000 | Iida et al. ...................... 117/20 |
| 6,113,687 A | * | 9/2000 | Horai et al. ................... 117/20 |
| 6,315,827 B1 | * | 11/2001 | Kurosaka et al. ............ 117/208 |
| 6,348,095 B1 | * | 2/2002 | Watanabe et al. ............. 117/13 |
| 6,348,180 B1 | * | 2/2002 | Iida et al. .................... 423/348 |
| 6,521,316 B2 | * | 2/2003 | Lee et al. ................... 428/64.1 |

FOREIGN PATENT DOCUMENTS

| | | | |
|---|---|---|---|
| JP | 409208377 A | * 8/1997 | |
| KR | 1998-3911 | 10/1998 | ........... H01L/21/00 |

OTHER PUBLICATIONS

Hourai et al., "Growth Parameters Determining the Type of Grown in Defects in CZ Silicon Crystals", Materials Science Forum, vol. 196–201 (1995), pp 1713–1718.*

* cited by examiner

*Primary Examiner*—Duy-Vu N. Deo
(74) *Attorney, Agent, or Firm*—Piper Rudnick LLP

(57) ABSTRACT

The present invention relates to a single crystalline silicon ingot, a single crystalline wafer, and a producing method thereof in accordance with the Czochralski method which enables reduction of a large defect area while increasing a micro-vacancy defect area in an agglomerated vacancy point area, which is the area between a central axis and an oxidation-induced stacking fault ring, by providing uniform conditions of crystal ingot growth and cooling and by adjusting a pulling rate for growing an ingot to grow, thus the oxidation-induced stacking fault ring exists only at an edge of the ingot radius.

13 Claims, 14 Drawing Sheets

Void nucleus generated region (33)

Oxygen precipitation enhanced region (31)

Radial direction of single crystal

SINGLE CRYSTALLINE SILICON WAFER, INGOT, AND PRODUCING METHOD THEREOF

This is a divisional application of prior application Ser. No. 09/742,215 filed Dec. 22. 2000. Now U.S. Pat. No. 6,521,316.

BACKGROUND OF THE INVENTION

1. Field of the Invention

The present invention relates to a single crystalline silicon ingot, a single crystalline wafer, and a producing method in accordance with the Czochralski method (hereinafter abbreviated the "Cz Method"), more particularly, to a single crystalline silicon ingot, a wafer and a method of producing a single crystalline silicon ingot which enables a large defect area to be reduced while increasing a micro-defect area in an agglomerated vacancy point area, which is the area between a central axis and an oxidation-induced stacking fault ring, by providing uniform conditions of crystal ingot growth and cooling and by adjusting a pulling rate for growing an ingot, thus the oxidation-induced stacking fault ring exists only at an edge of the ingot radius.

2. Discussion of Related Art

A silicon wafer to fabricate electronic devices such as a semiconductor and the like is provided by thinly slicing a single crystalline silicon ingot. A well-known method of producing a single crystalline ingot for a wafer used for electronic devices such as semiconductor devices is that of Cz Method. The Cz Method makes a crystal grow by dipping a single crystalline seed crystal into molten silicon and then pulling it slowly; this is explained in detail by "Silicon Processing for the VLSI Era", Volume 1, Lattice Press (1986), Sunset Beach, Calif., by S. Wolf and R. N. Tauber. A general method for producing a single crystalline silicon ingot by the Cz Method will be explained in the following description in connection with the appended drawings.

First of all, a necking step of growing a thin and long crystal out of a seed crystal is carried out followed by a shouldering step which is performed for growing the crystal radially to attain a target diameter. Then, a body growing step to obtain a crystal having a predetermined diameter is carried out. A part grown by the body-growing step becomes a wafer. After the body growing step has been carried out to provide a wafer having a predetermined length, the body growing step is terminated followed by a tailing step of separating the body from the molten silicon by which diameter is reduced gradually.

All these steps are carried out in a space called a "hot zone" in a grower of a crystal growing apparatus where the molten silicon grows to turn into a single crystalline ingot. The grower includes a melt-down silicon instrument, a heater, a heat insulating body, and an ingot-pulling apparatus.

As the defect characteristic inside an ingot depends on the sensitivity of the growing and cooling conditions of the crystal, efforts have been made to control the species and distributions of crystal growing defects by controlling the thermal environment near a crystal growing interface. The crystal growing defects are largely divided into an agglomerated vacancy type defect and an interstitial type defect. If the amount of vacancy type defects or interstitial type defects exist more than equilibrium concentration, agglomeration is commenced and then systematic defects in the crystal may be evolved.

The Voronkov theory, introduced in "The Mechanism of Swirl Defects Formation in Silicon," Journal of Crystal Growth 59,625 (1982), by V. V. Voronkov, teaches that such defect formation is closely related to a value of V/G wherein V is a pulling rate of an ingot and G is a temperature gradient near the crystal growing interface. Based on the Voronkov theory, an agglomerated vacancy type defect occurs when the value of V/G exceeds a critical value, while an agglomerated interstitial type defect occurs when the value of V/G is lower than the critical value. Therefore, the pulling rate has an influence on the species, sizes and density of the defects existing in the crystal when a crystal is grown according to given growing environment.

FIG. 1 and FIG. 2 show the defect characteristics of an ingot grown by a related art. FIG. 1 shows a defect area which is generated and grown along a length direction of an ingot by varying a pulling rate. The ingot is first grown by pulling up an upper part of the drawing with high speed and then by gradually slowing down the pulling rate to grow a lower part. In other words, the lower part is grown by a low pulling rate and the upper part is grown by accelerating the pulling rate.

Referring to FIG. 1, an interstitial point defect area 11 is generated from a part grown with low speed, while a vacancy point defect area 12 exists at an area generated with a high pulling rate. An oxidation-induced stacking fault area 13, an area free of agglomerated vacancy point defect 14 and an area free of agglomerated interstitial point defect 15 are sequentially arranged from the agglomerated vacancy point defect area 12 between the agglomerated vacancy point defect area 12 and the interstitial point defect area 11. The oxidation-induced stacking fault area is pushed back to the peripheral edge by increasing the pulling rate beyond a predetermined level, thereby distributing the agglomerated vacancy point defects throughout the entire cross-section.

On the other hand, the oxidation-induced stacking fault area is shrunken to the center of the cross-section and eliminated eventually as the pulling rate is reduced, thereby generating the area free of agglomerated vacancy point defects. As the pulling rate is further decreased, an area free of agglomerated interstitial point defect is produced. As the pulling rate is further reduced, the agglomerated interstitial point defect area 11 exists throughout the entire cross-section.

However, the method of producing an ingot according to the related art is unable to provide uniform cooling conditions of axial temperature gradient G in the radial direction of the ingot due to weakness of the hot zone during the growth of crystal. Specifically, heat at the center of the ingot is transferred to the edge of the ingot through conduction and then radiates therefrom, while the heat at the edge of the ingot is directly dissipated by radiation. Therefore, differences in the temperature gradient occur in the radial direction of the ingot.

Generally, the G value increases from the center of the ingot to the edge radially. Thus, when the pulling rate at the center is same as that around the edge, the V/G value at the center increases, causing a significant increase in the agglomerated vacancy point defect. In such central region, coarsely agglomerated vacancy point defects such as Crystal Originated Particle ("COP") or Flow Pattern Defect ("FPD") prevails.

FIG. 2 shows a horizontal cross-sectional view of an ingot bisected along the cutting line II in FIG. 1 to represent defect distribution.

An Oxidation-induced Stacking Fault ring ("OiSF") 13a, is located at an edge of an ingot which is pulled up with the pulling rate indicated as II in FIG. 1. The drawing shows a typical defect distribution of a horizontal cross-section of a single crystal grown by the Cz method by adjusting the ingot pulling rate to a high level.

As shown in FIG. 2, a coarsely agglomerated vacancy point defect area 12 having coarsely agglomerated vacancy point defects exists at the central part of the ingot 10. An oxidation-induced stacking fault ring 13a exists at a location surrounding the coarsely agglomerated vacancy point defect area 12. Further, an area free of an agglomerated vacancy point defect area (vacancy dominating) 15 surrounds the oxidation-induced stacking fault ring 13a. When the oxidation-induced stacking fault ring 13a is located at the circumferential part of the ingot according to the related art, coarsely agglomerated vacancy point defects such as COP and FDP exist at the central part of the ingot. Thus, the ingot cannot be used as a substance for the production of highly-integrated semiconductor devices of micro Critical Dimension ("CD").

Accordingly, the ingot according to the related art is unsuitable for a wafer upon which micro electronic circuits are to be formed due to the generation of coarsely agglomerated vacancy point defects as the pulling rate is increased for ingot growth. In addition, the productivity of the related art is reduced when the pulling rate is decreased in order to reduce the large defects. Moreover, the related art may generate interstitial defects larger than the large defects of agglomerated vacancy point defect such as Large Dislocation Pit ("LDP") on a cross-section of a wafer.

SUMMARY OF THE INVENTION

Accordingly, the present invention is directed to a single crystalline silicon ingot, a single crystalline wafer, and a method for their production in accordance with the Cz Method that substantially obviates one or more of the problems due to limitations and disadvantages of the related art.

The object of the present invention is to provide a wafer which enables productivity to be increased by increasing the pulling rate of an ingot that may be used for the production of highly-integrated devices of micro CD.

Additional features and advantages of the invention will be set forth in the description which follows and in part will be apparent from the description, or may be learned by practice of the invention. The objectives and other advantages of the invention will be realized and attained by the structure particularly pointed out in the written description as well as the appended drawings.

To achieve these and other advantages and in accordance with the purpose of the present invention, as embodied and broadly described, the present invention includes a single crystalline silicon wafer having a front face and a back face which are vertical to a central axis and providing a circumferential part formed with the extended front and back faces as well as a radius from the central axis. The wafer is a disk type, with an area free of agglomerated vacancy point defect less than 10% of the radius from the wafer circumference to the central axis, an oxidation-induced stacking fault ring adjacent to the area free of agglomerated vacancy point defect, and a micro-vacancy defect area having no defect as large as FPD but direct surface oxide defect ("DSOD") from an inner edge of the oxidation-induced stacking fault ring to the central axis.

Preferably, the micro-vacancy defect area has a width greater than 10, 20 or 30% of the radius, and occupies an area from the oxidation-induced stacking fault ring to the central axis. It is also preferable that the micro-vacancy defect area and the oxidation-induced stacking fault ring exist on the wafer only, a large defect area exists in the micro-vacancy defect area and includes COP defects over 0.08 μm with the number equal to or less than 20, and initial oxygen concentration of the wafer is under 12 ppma.

In another aspect, the present invention includes a single crystalline silicon ingot having a predetermined radius from a central axis, the ingot including a body having a predetermined length along the central axis, the ingot including an oxidation-induced stacking fault ring as a coaxial type ring at a circumferential part relative to the central axis, and a micro-vacancy defect area just inside the oxidation-induced stacking fault ring in a direction toward the central axis, the micro-vacancy defect area having no FPD defect.

Preferably, the micro vacancy defect area has a width greater than 10, 20 or 30% of the radius, and the micro-vacancy defect area occupies an area from the oxidation-induced stacking fault ring to the central axis. It is also preferable that only the micro-vacancy defect area and the oxidation-induced stacking fault ring exist on the wafer, the micro-vacancy defect area is equal to or longer than 10, 20, 30 or 40% of the body length, and initial oxygen concentration of the ingot is under 12 ppma.

In further aspects, the present invention includes a method of producing a single crystalline silicon ingot by the Cz Method wherein the ingot has a predetermined radius from a central axis and includes a body having a predetermined length along the central axis. The method comprises the steps of reducing an axial temperature gradient of a circumferential part of the body by installing a heat shield to prevent the body of the ingot grown from a melt-down silicon from being cooled down abruptly and by adjusting a melting gap between a lower part of the heat shield and a surface of the melt-down silicon; forming an oxidation-induced stacking fault ring as a coaxial-type ring at a circumferential part furthest from the central axis by controlling a growth speed and maintaining a uniform overall axial temperature gradient by making the axial temperature gradient of the central part similar to that of the circumferential part by increasing the axial temperature gradient of the central part by reducing the temperature of upper parts of the ingot and the heat shield; and forming a micro-vacancy defect area having no FPD defect but DSOD defect just inside the oxidation-induced stacking fault ring in a direction toward the central axis.

Preferably, the micro-vacancy defect area has a width greater than 10, 20, 30 or 40% of the radius, and initial oxygen concentration of the ingot is under 12 ppma.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention and together with the description serve to explain the principle of the invention.

Figure 5:
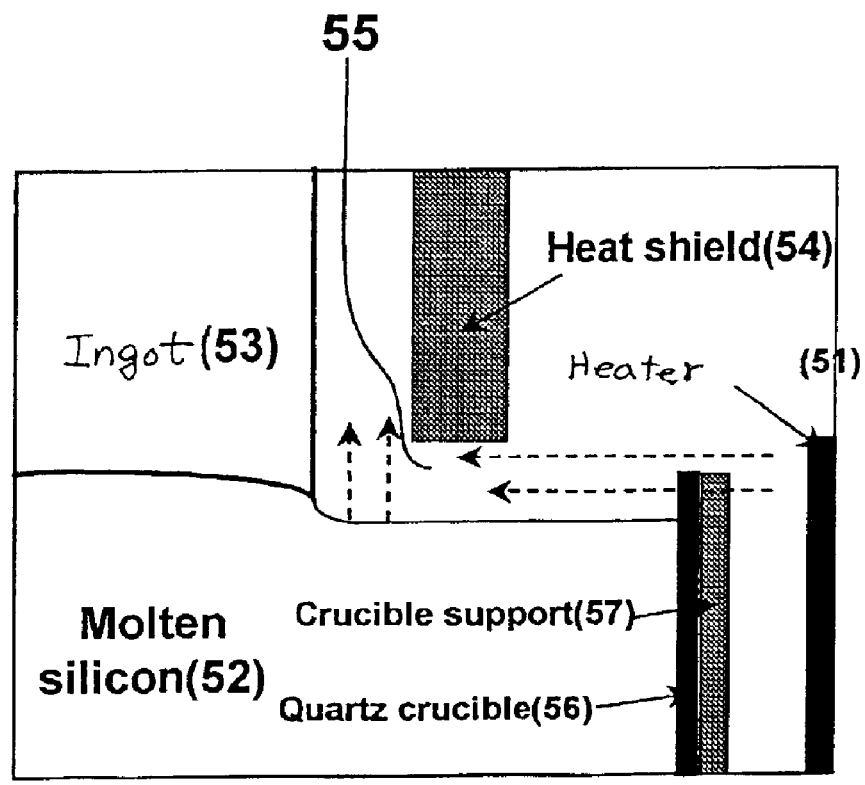
Figure 6:
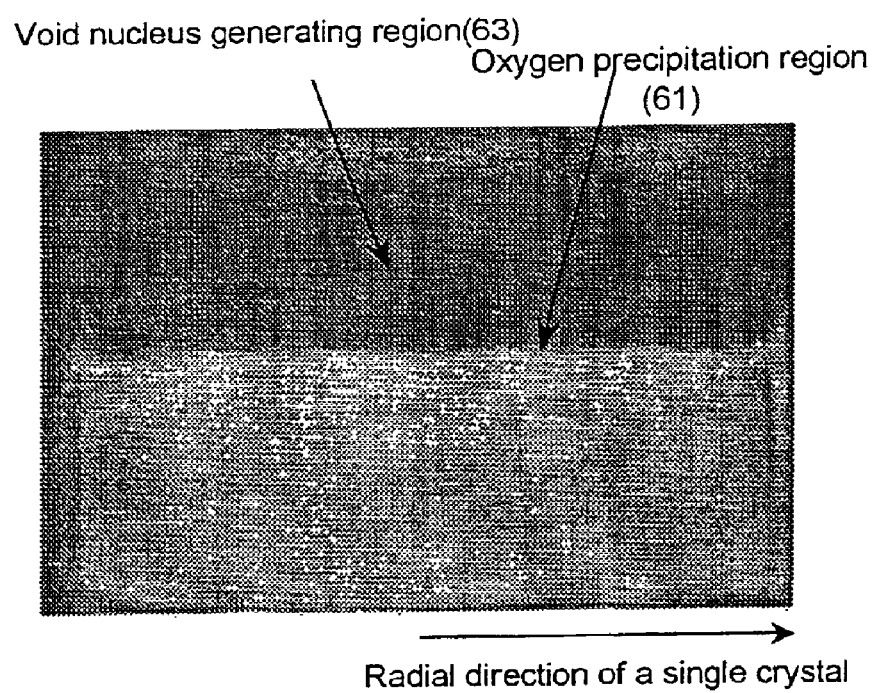
Figure 7:
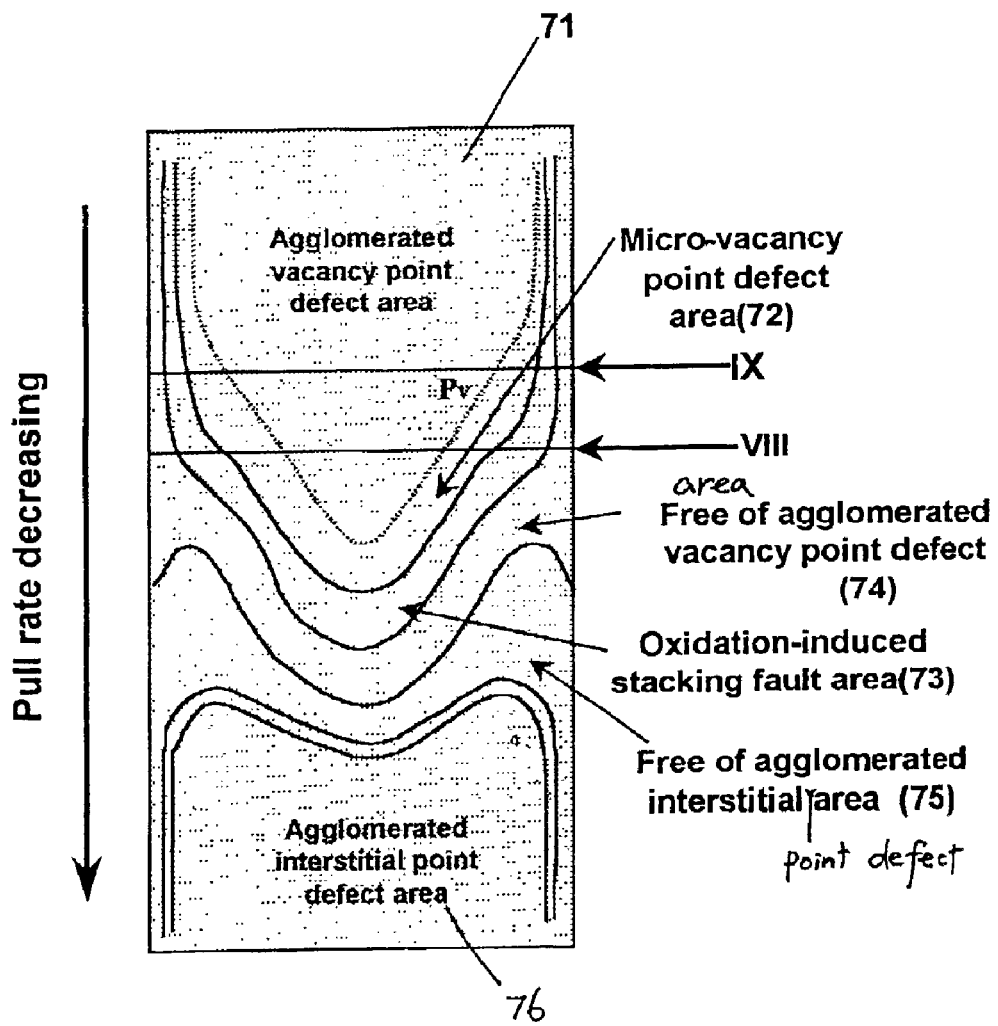
Figures 8, 9:
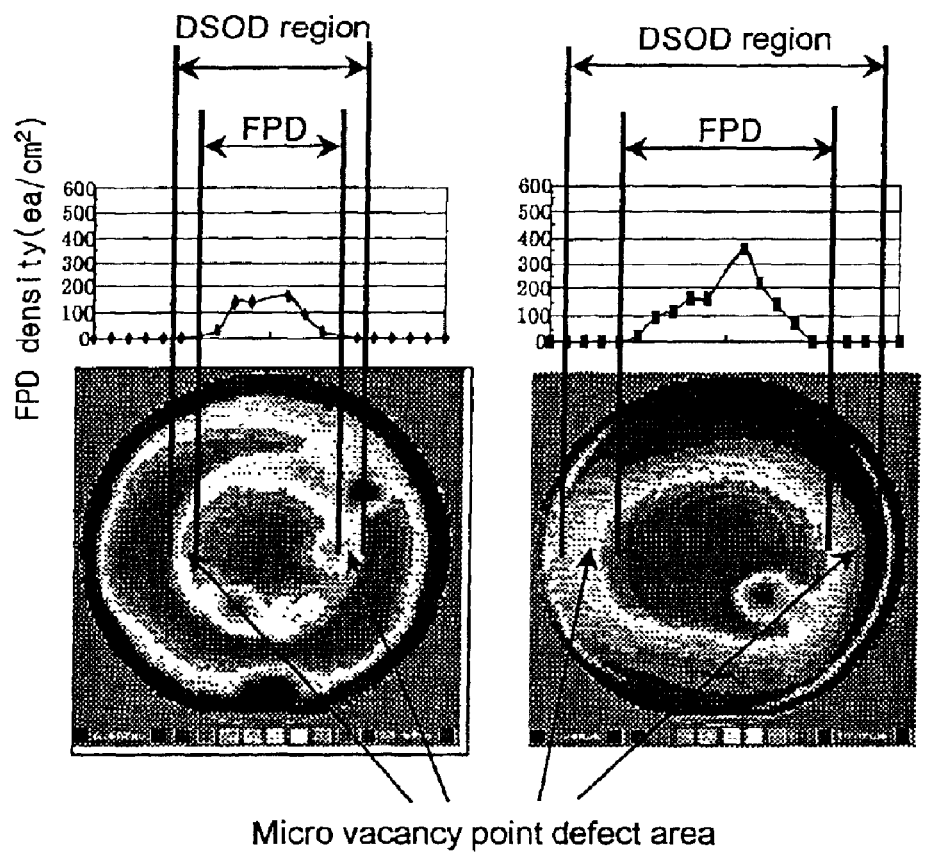
Figure 10:
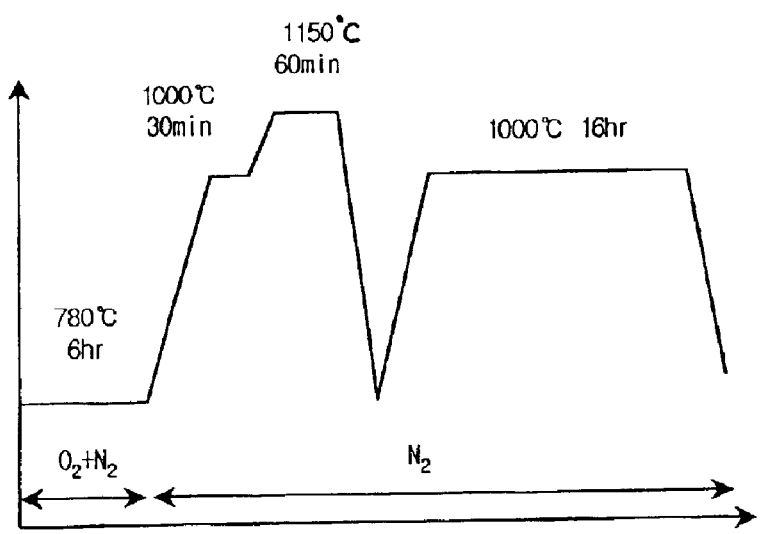
Figure 11:
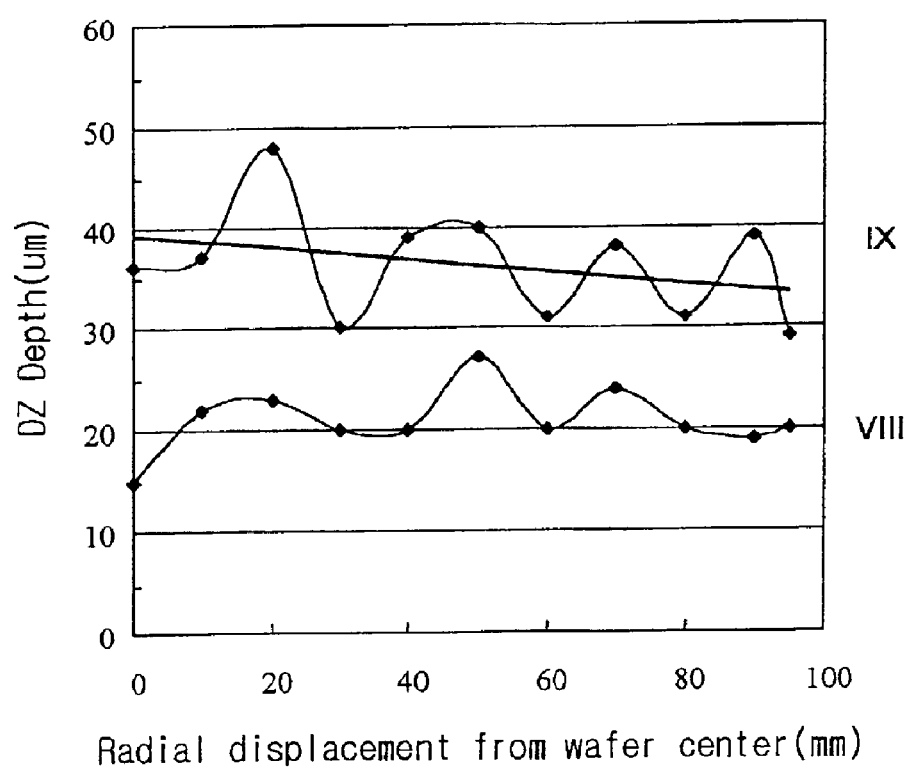
Figure 12:
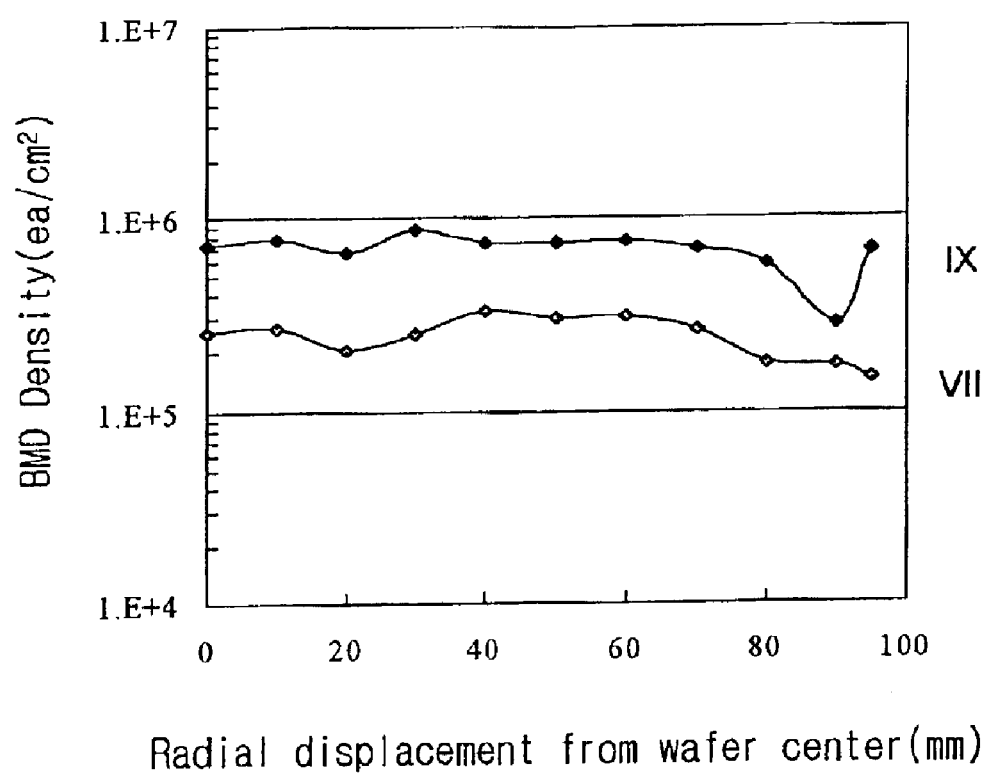
Figure 13:
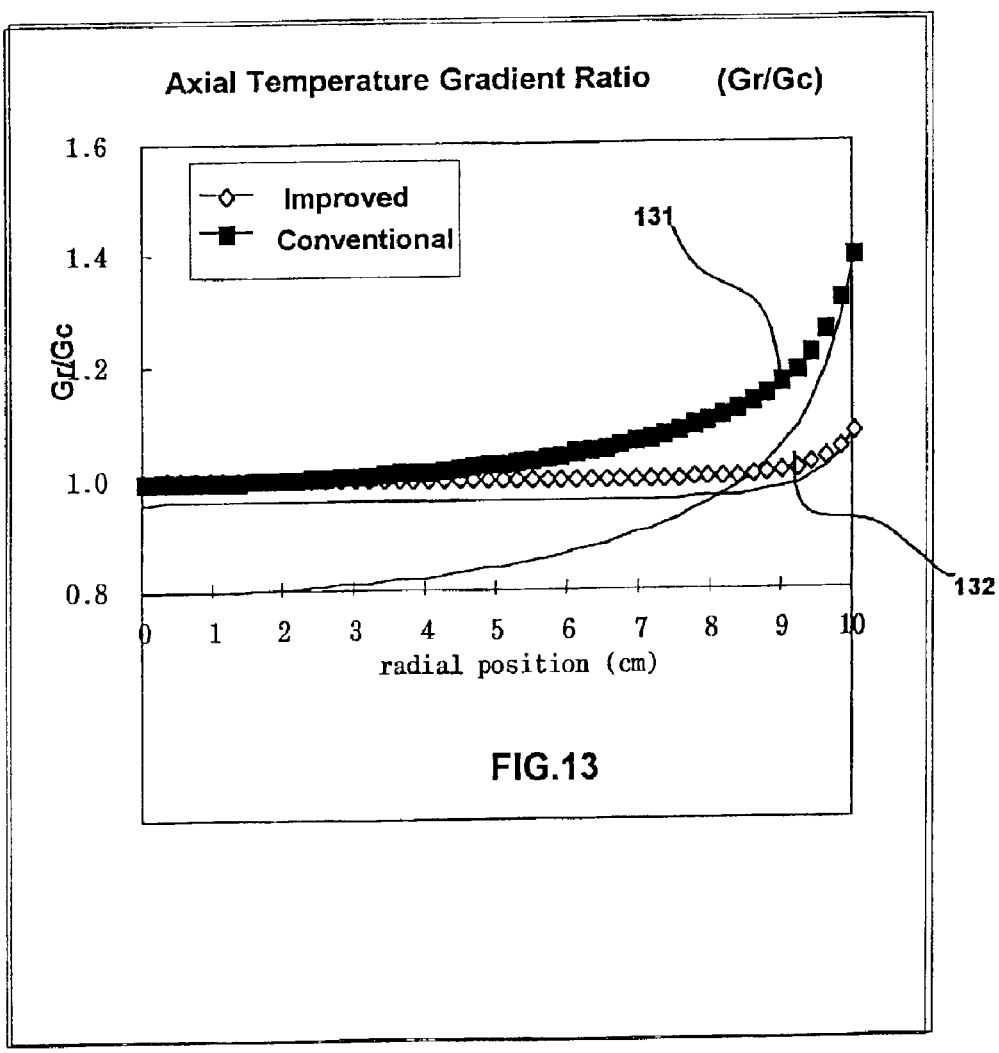
Figure 14:
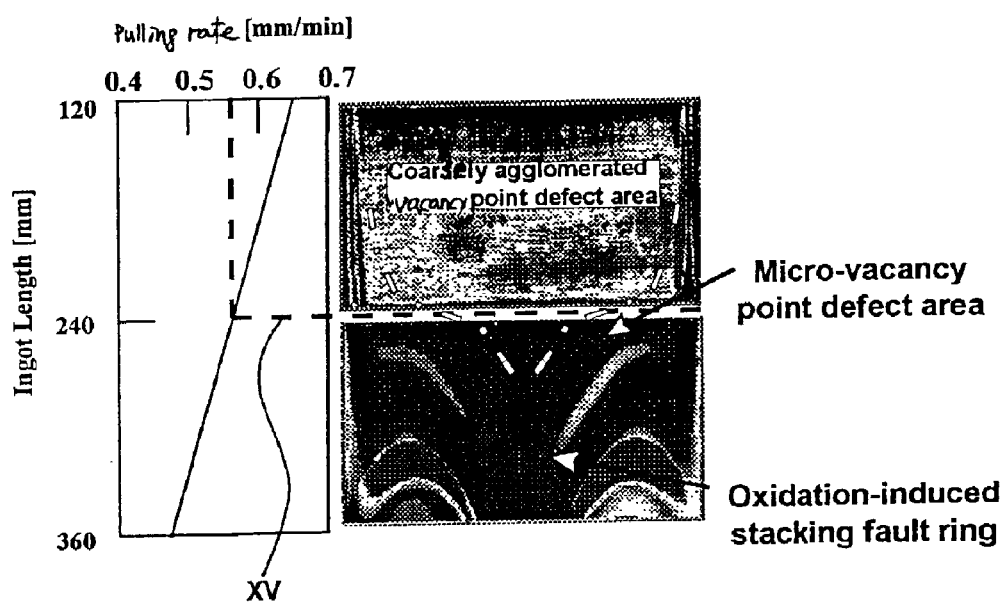
Figure 15:
Figure 16:
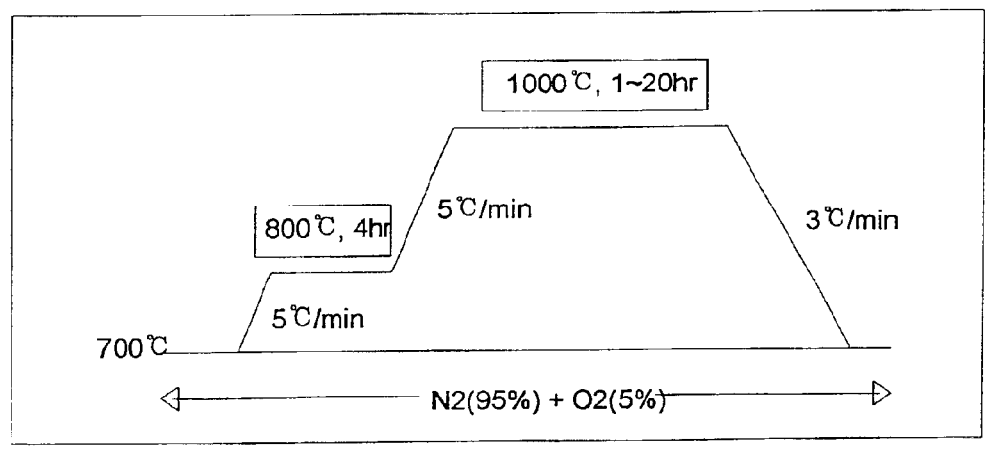

FIG. 5 schematically shows a hot zone near a growth interface;

FIG. 6 shows an XRT vertical cross-sectional view of an ingot that was subjected to a holding test in a hot zone in which radial growth and cooling conditions are uniform;

FIG. 7 shows a schematic view of an ingot bisected vertically wherein the ingot is grown by reducing a pulling rate in a hot zone in which the radial thermal condition is uniform;

FIG. 8 and FIG. 9 show radial distributions of FPD and DSOD areas in the 8-inch single crystal indicated as VIII and IX in FIG. 7, respectively;

FIG. 10 shows a heat treatment cycle applied to an ingot which is for a 256M DRAM device schematically;

FIG. 11 shows a graph of DZ depth of a wafer indicated as VIII and IX in FIG. 7;

FIG. 12 shows a graph of BMD density of a wafer indicated as VIII and IX in FIG. 7;

FIG. 13 is a graph of the axial temperature gradient in a hot zone demonstrating radial growth and cooling conditions of an ingot;

FIG. 14 shows a schematic view of an ingot bisected vertically wherein the ingot is grown by reducing a pulling rate in a hot zone in which the radial thermal condition is uniform;

FIG. 15 is a graph of FDP defect distribution measured at cross-section XV in FIG. 14 after heat-treating a wafer by the heat treatment cycle of FIG. 16; and FIG. 16 is a graph of a heat treatment cycle according to the present invention.

DETAILED DESCRIPTION OF PREFERRED EMBODIMENTS

Reference will now be made in detail to the preferred embodiments of the present invention, examples of which are illustrated in the accompanying drawings.

The terminology's and abbreviations used in the specification are as follows.

Micro-vacancy defect Area: A semiconductor wafer needs to be free of significant defects to secure the processes for forming various electronic circuits thereon as well as operation of the circuits as designed. To detect large defects causing malfunctions of the electronic circuits on the semiconductor wafer itself, various ways were developed and named after the finders such as COP, FPD, LSTD, OiSF, DSOD and the like, defined below. Micro-vacancy defect area is an area where DSOD may be found but no operational malfunction occurs on electronic circuits over 64M DRAM, and where COP, FPD, and LSTD are not found. In other words, a wafer, which may include DSOD, is suitable for producing IC over 64M DRAM provided that there is no COP, FPD and LSTD.

MCLT: Minority Carrier Life Time
COP: Crystal Originated Particle
FPD: Flow Pattern Defect
LSTD: Light Scattering Topography Defect
OiSF: Oxidation—induced Stacking Fault Ring
DSOD: Direct Surface Oxide Defect
BMD: Bulk Micro-Defect
DZ: Denuded Zone
XRT: X-Ray Topography Generally, heat at the center of an ingot is transferred to the circumferential part of the ingot through conduction and then radiates therefrom, while the heat at the circumference is dissipated by direct radiation. Therefore, difference of temperature gradient of axial temperature gradients occurs in the radial direction of the ingot. To reduce such a difference of temperature gradient, the axial temperature gradient at the ingot circumference may be decreased or that at the center of the ingot may be increased.

In order to reduce the difference of the temperature gradient, an interval, i.e., a melting gap, between a heat shield bottom and a melt-down silicon is adjusted to control the quantity of heat radiated from a heater to the circumferential ingot, thereby reducing the axial temperature gradient of the ingot circumference. Additionally, the axial temperature gradient of the central part of the ingot is increased by cooling down upper parts of the ingot and the heat shield.

FIG. 5 schematically shows a hot zone near a growth interface. Referring to FIG. 5, the difference in cooling speeds of the respective radial locations is lessened by reducing the cooling speed of the ingot circumference by controlling radiation heat from a melt-down silicon 52 melted in a quartz crucible 56 supported by a crucible support 57 or with a heater 51 using a heat shield 54. In this case, the heat shield 54 is made of a thermally-insulating substance so as not to transfer heat from the melt-down silicon 52 to the upper part of the ingot 53.

The cooling speed of the ingot circumference near the interface is decreased by preventing the heat from being easily leaked through the melting gap, that is, a space 55 between a bottom of the heat shield 54 and a surface of the melt-down silicon 52. Moreover, the cooling condition is controlled by varying a surface size of the ingot 53 and the radiating heat from the heater 51 by adjusting the height of the melting gap 55.

Uniformity of cooling conditions in the radial direction of the ingot can be verified by a holding test described in "Grown-in Microdefects, Residual Vacancies and Oxygen Precipitation Bands in Czochralski Silicon", *Journal of Crystal Growth* 204, 462 (1999), by V. V Voronkov and R. Falster, which describes that specific oxygen precipitation patterns appear in an ingot crystal that was subjected to the holding test.

Figure 3:
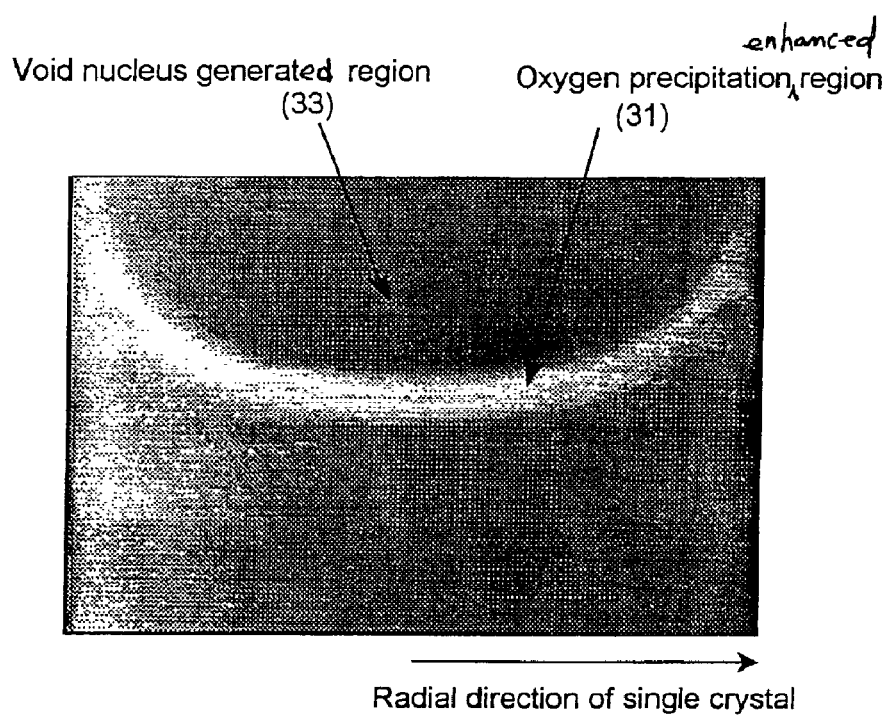
FIG. 3 is a picture of XRT(X-ray topography) showing a vertical cross-section of an ingot that was subjected to a holding test in a general hot zone according to the related art.

An XRT image of a vertical cross-section of a crystalline ingot that was subjected to the holding test at a general hot zone is shown in FIG. 3. The bright region 31 is an oxygen precipitation enhanced region, and a void nucleus generated region 33 exists above the oxygen precipitation enhanced region 31. Such region appears to the portion of the ingot on which temperature reaches about 1070° C. during the holding test.

FIG. 6 shows an XRT vertical cross-sectional view of an ingot that was subjected to a holding test in a hot zone in which radial growth and cooling conditions are uniform. Compared to the vertical cross-sectional view in FIG. 3, FIG. 6 shows that the boundary between the oxygen precipitation region 61 and the void nucleus generating region 63 is formed in parallel to the radial direction of an ingot, thereby indirectly indicating that the point defect concentration and cooling speed in the crystal are radially uniform.

Figure 4:
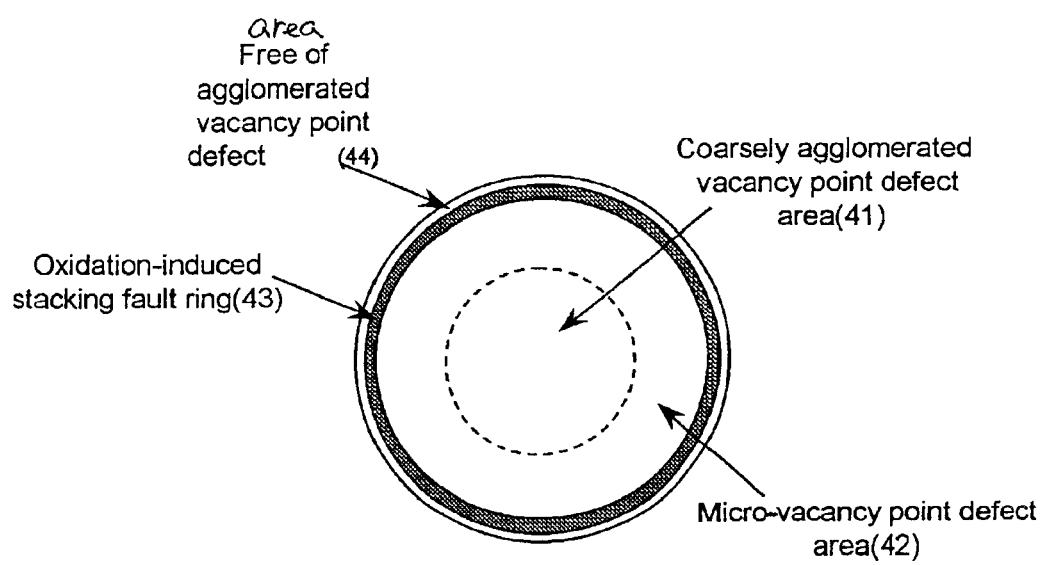
FIG. 4 shows a cross-sectional view of an ingot bisected radially wherein the ingot is fabricated by adjusting a pulling rate to have an oxidation-induced stacking fault ring located at the circumferential part of the crystalline ingot in a hot zone in which the cooling condition is uniform in accordance with the present invention.

FIG. 4 shows a schematic radial defect distribution of an ingot grown in a hot zone in which crystal growth and cooling conditions are radially uniform. Once defect distribution of a wafer, which is made by cutting a single crystalline ingot grown under hot zone conditions such that thermal history difference to the radial direction of an ingot is minimized and that a vacancy area exists through the entire ingot, is inspected, as shown in FIG. 4, coarsely agglomerated vacancy point defects such as COP or FPD exist with low density on the central part 41 and a micro-vacancy defect area 42 surrounds it. Successively, an oxidation-induced stacking fault ring 43 and an area free of agglomerated vacancy point defect 44 provide thin layers surrounding the micro-vacancy defect area 42. In this example, the area free of agglomerated vacancy point defect 44 is formed to a width narrower than 10% of the radius.

Figure 1:
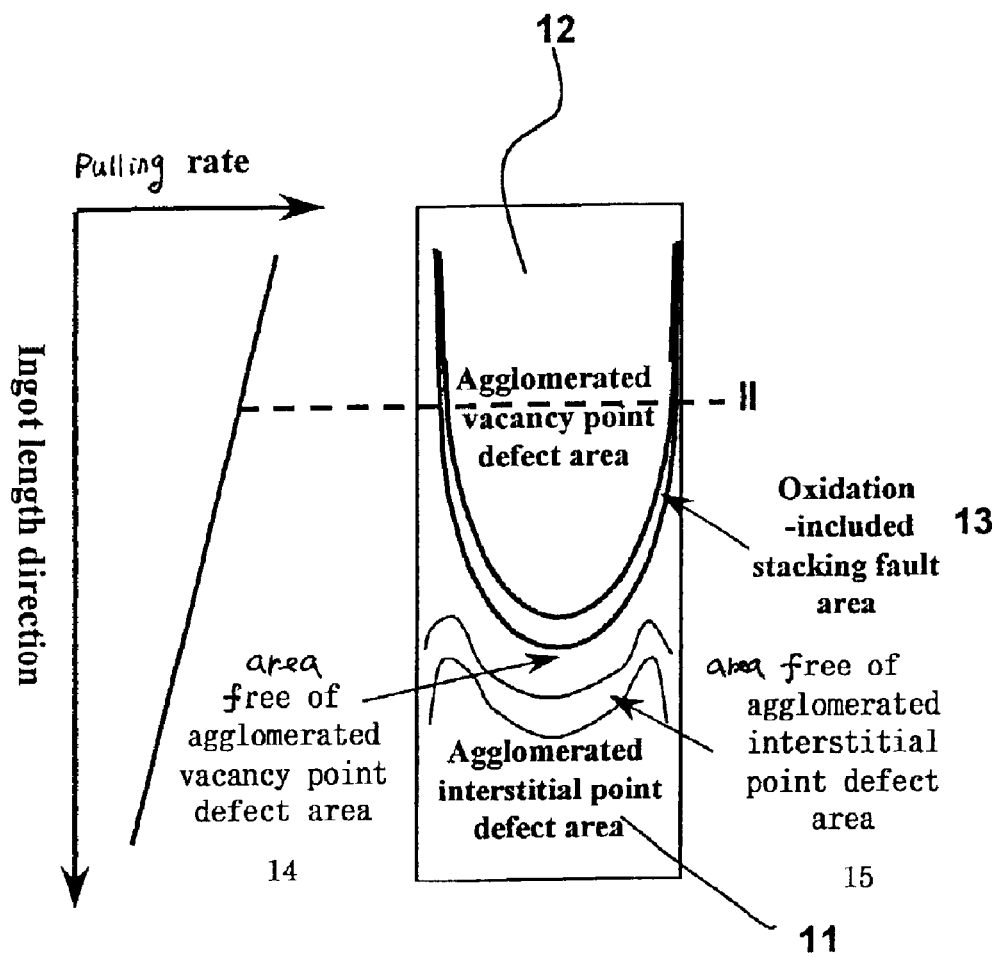
FIG. 1 shows a defect area which is generated and grown along a length direction of an ingot by varying a pulling rate according to a related art.
Figure 2:
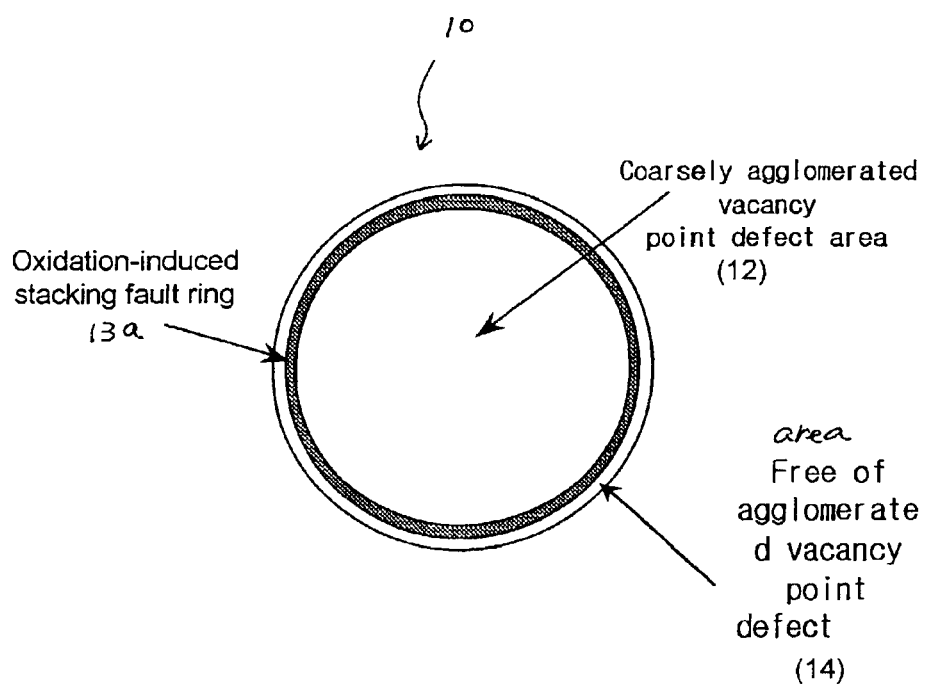
FIG. 2 shows a horizontal cross-sectional view of an ingot bisected along the cutting line II in FIG. 1 to represent defect distribution wherein the ingot is fabricated by adjusting a pulling rate to have an oxidation-induced stacking fault ring located at the circumferential part of the crystalline ingot in a hot zone according to a related art.

The outstanding difference of using the inventive method from the cross-section of the ingot grown according to the related art, as shown in FIG. 2, is that the large defects such as COP and FPD are confined within a central part surrounded by the micro-vacancy defect area 42.

According to the present invention, the micro vacancy defect area has no FPD but may have DSOD, while the coarsely agglomerated vacancy point defect area indicates that FPD is distributed thereon. As already defined, the size of DSOD defect is substantially smaller than that of FPD near the wafer surface. As the integration of a chip increases, CD of a device decreases abruptly. It is known that a wafer used for a VLSI device over 64 or 128 MB permits no FPD, but can tolerate DSOD.

Embodiment 1

A heat shield designed to provide a uniform cooling condition radially around a growth interface in a crystal cuts off heat from a melt-down silicon and allows the crystal to easily cool down, while also slowing down the cooling of temperature at a surface of the crystal between the heat shield and the melt-down silicon surface, thereby eventually reducing the difference of cooling speeds between the surface and inner part of the crystal, simultaneously.

The radial uniformity of vertical cooling speed is improved by adjusting the melting gap, and the result of the holding test performed to verify the uniformity has been described as shown in FIG. 6.

While controlling the vertical cooling speed uniformly in the radial direction, the pulling rate of an ingot is taken fast initially and then taken slowly to complete the ingot. In this case, the oxygen concentration is adjusted between 8 and 12 ppma depending on the flow of ambient gas and the rotation speed of the quartz crucible.

FIG. 7 represents the result of defect distribution of an 8-inch single crystalline silicon ingot which is grown by the above method and bisected vertically. The defect distribution along with the cutting lines VIII and IX in FIG. 7 are shown in FIGS. 8 and 9, respectively.

As shown in FIG. 7, an agglomerated vacancy point defect area 71 dominates at a part where the ingot was grown with a high pulling rate. Yet, a micro-vacancy defect area 72 increases when the pulling rate is reduced. An oxidation-induced stacking fault area 73 increases as soon as the agglomerated vacancy point defect area 71 decreases, provided that the pulling rate is reduced below a predetermined level. When the pulling rate is reduced even more, the oxidation-induced stacking fault area starts to move from the ingot circumference to the central axis to form an area free of agglomerated vacancy point defect 74 at the circumference such that the width of the agglomerate-intrinsic-point-defect free area 74 increases. The agglomerate-intrinsic-point-defect free area may be divided into an area free of agglomerated vacancy point defect 74 and an area free of interstitial point defect 75. When the pulling rate is further reduced, an interstitial point defect area 76 is generated.

FIG. 8 and FIG. 9 illustrate the defect distribution. As shown in the drawings, a micro-vacancy defect area exists between the oxidation-induced stacking fault area 73 and the dotted line in the vacancy point defect area, shown in FIG. 7. FIGS. 8 and 9 further include test results of distribution of FPD defects using chemical etching of wafers cut along the lines VIII and IX, respectively.

As shown in the drawings, an area free of agglomerated vacancy point defect 44 (referring to FIG. 4) in which the width is less than 10% of a radius, is located from a wafer circumference to a central axis, and an oxidation-induced stacking fault ring 43 adjacent to the area 44 exists successively. Distributed at the wafer circumference, the oxidation-induced stacking fault area in FIG. 8 occupies a region wider than that in FIG. 9 due to the difference of the pulling rate. A DSOD region having micro-vacancy defects exists from the center to an oxidation-induced stacking fault ring, while an FPD area having large defects exists only in the central part, thereby providing evidence that the micro vacancy defect area actually exists thereon.

As the thermal history uniformity is increased in the radial direction, the micro-vacancy defect area is proportionally extended to the center of the wafer, thereby eventually eliminating the large defect area. Thus, the inner part of the oxidation-induced stacking fault ring becomes the micro-vacancy defect area.

FIG. 10 illustrates the heat treatment cycle used during a 256M DRAM device production. The graph shows a heat treatment cycle by hearting up to 1000° C. for 30 minutes, then increasing the temperature up to 1150° C. for 60 minutes, cooling down to 780° C., followed by heating up to 1000° C. for 16 hours, and cooling down.

For a good quality wafer, Bulk Micro-Defect ("BMD") of high density under the surface of a wafer in a predetermined depth is required for the production of circuits on the wafer, which enables removal of metal contaminants. FIG. 11 shows a graph of Denuded Zone ("DZ") depth of a wafer indicated as VIII and IX in FIG. 7. The DZ is a distance from a wafer surface to a BMD area. FIG. 12 shows a graph of BMD density of a wafer indicated as VIII and IX in FIG. 7.

Referring to FIG. 11 and FIG. 12, a BMD density and a DZ depth are attained relatively uniformly in the radial direction. After the heat treatment cycle in FIG. 10 has been applied, it is found that the oxidation-induced stacking fault area actually has no oxidation-induced stacking faults. An initial oxygen concentration of the used wafer is under 12 ppma. Once an entire ingot body is grown under the surrounding conditions and using the pulling rate shown at the cutting lines VIII and IX in FIG. 7 and with the use of the above result, an ingot having the defect distributions shown in FIG. 8 and FIG. 9 is attained.

In addition, if the uniformity of the axial temperature is adjusted well, it is possible to grow an ingot able to provide a wafer which has neither COP nor FPD and has micro-vacancy defects distributed only from an inner diameter of the oxidation-induced stacking fault ring to a central axis of the ingot.

Embodiment 2

In order to achieve uniform crystal growth and cooling conditions radially, an axial temperature gradient at an ingot circumference is reduced by controlling the heat radiated from a heater to an ingot circumference in a manner that the gap between a heat shield bottom and a melt-down silicon is adjusted and upper parts of the ingot and heat shield are cooled down, thereby increasing the axial temperature gradient at the central part of the ingot. Thus, a radial Gr/Gc becomes a curve as shown in FIG. 13 and an ingot is grown in accordance with the axial temperature figures of Table 1.

TABLE 1

| Items | Conventional | Improved |
|---|---|---|
| $\Delta G$ (K/cm) | 16.49 | 2.87 |
| $G_{1,c}$ (K/cm) | 13.29 | 32.31 |
| $G_{1,e}$ (K/cm) | 11.25 | 43.55 |
| $G_{2,c}$ (K/cm) | 10.94 | 23.81 |
| $G_{2,e}$ (K/cm) | 9.94 | 26.14 |

An axial temperature gradient 132 from the ingot center to the circumference under the ambient conditions of the embodiment of the present invention, as shown in FIG. 13, is more uniform than the conventional temperature gradient 131 of the related art.

Table 1 shows axial temperature gradient numerals of thermal conditions shown at FIG. 13, wherein $\Delta G = Ge - Gc$ (K/cm) ($\Delta G$ is a difference between axial temperature gradients of an ingot circumference and an ingot center adjacent to an interface of the melt-down silicon). G1 is an average value of an interval where COP is generated between 1120° C. and 1070° C., G2 is an average value of an interval where OiSF nuclei are generated between 1070° C. and 800° C., and subscripts 'c', 'e' and 'r' (shown in FIG. 13) are a central part, circumference and arbitrary radius of an ingot, respectively. $\Delta G$ should be equal to or less than 3 K/cm.

As shown in Table 1, $\Delta G$ of the related art is 16.49 K/cm, while $\Delta G$ of the present invention is 2.87 K/cm. In the embodiment of the present invention, $\Delta G$ is maintained under 3 K/cm. Average values, which are greater than those of the related art, of axial temperature gradient of the ingot center and the ingot circumference between the interval 1120° C. to 1070° C. where COP is mainly generated are 32.31 K/cm and 43.55 K/cm, respectively. And, average values, which are much greater than those of the related art, of axial temperature gradient of the ingot center and the ingot circumference between an interval 1070° C. to 800° C. where OiSF nuclei are mainly generated are 23.81 K/cm and 26.14 K/cm, respectively. Therefore, the temperature interval during which the defects are generated passes so quickly that the defects have less chance to be generated.

FIG. 14 shows a schematic view of a cross-section of an ingot bisected vertically wherein the ingot is grown by reducing a pulling rate in a hot zone in which the radial thermal condition is uniform, wherein the pulling rate is reduced from 0.65 mm/min. to 0.48 mm/min and the cross-section is located 360 mm from a shoulder of the ingot. In addition, FIG. 14 shows a vertical cross-section of a single crystalline silicon ingot being matched with a pulling rate according to an embodiment of the present invention, wherein an image is attained by carrying out thermal treatment on the cross-section of the ingot grown by reducing the pulling rate from 0.65 mm/min. to 0.48 mm/min., along the cycle in FIG. 16, and then by scanning the cross-section with a Minority Carrier Scan of the Minority Carrier Life Time ("MCLT"). As shown in FIG. 14, it is desirable to set the pulling rate over 0.55 mm/min.

As shown in FIG. 15, when the wafer bisected along the cutting line XV is inspected to find defects after a heat treatment such as the heat treatment cycle in FIG. 16, FPD under 250 ea./cm$^2$ are found at a part, with most of the defects being in the central part. In this case, the wafer is provided by cutting the body 240 mm from the shoulder.

FIG. 16 is a graph of a heat treatment cycle carried out by heating up to 800° C. at a rate of 5° C./min., maintaining that state for 4 hours, heating up to 1000° C., maintaining that state for a period of time, preferably 16 to 20 hours, and cooling down at a rate of 3° C./min. Accordingly, compared to the ingot grown according to the related art, a single crystalline ingot fabricated by the above-mentioned method enables the pulling rate to be increased with size and density of crystalline defect being reduced, thereby improving productivity and wafer quality without increasing product-cost.

It will be apparent to those skilled in the art that various modifications and variations can be made in a single crystalline silicon ingot, a single crystalline wafer, and a producing method thereof of the present invention without departing from the spirit or scope of the inventions. Thus, it is intended that the present invention cover the modifications and variations of this invention provided they come within the scope of the appended claims and equivalents.

What is claimed is:

1. A method of producing a single crystalline silicon ingot by a Czochralski Method wherein the ingot has a predetermined radius from a central axis and includes a body having a predetermined length along the central axis, the method comprising the steps of:

reducing an axial temperature gradient of a circumferential part of the body by installing a heat shield to prevent the body of the ingot grown from a melt-down silicon from being cooled down abruptly and by adjusting a melting gap between a lower part of the heat shield and a surface of the melt-down silicon;

forming an oxidation-induced stacking fault ring as a coaxial-type ring at a circumferential part furthest from the central axis by controlling a growth speed and maintaining a uniform overall axial temperature gradient by making the axial temperature gradient of a central part similar to that of the circumferential part by increasing the axial temperature gradient of the central part by reducing temperature of upper parts of the ingot and the heat shield; and forming a micro-vacancy defect area having no FPD just inside the oxidation-induced stacking fault ring in a direction toward the central axis.

2. The method of producing a single crystalline silicon ingot according to claim 1, wherein the micro-vacancy defect area has a width greater than 10% of the radius.

3. The method of producing a single crystalline silicon ingot according to claim 1, wherein the micro-vacancy defect area has a width greater than 20% of the radius.

4. The method of producing a single crystalline silicon ingot according to claim 1, wherein the micro-vacancy defect area has a width greater than 30% of the radius.

5. The method of producing a single crystalline silicon ingot according to claim 1, wherein the micro-vacancy defect area occupies an area from the oxidation-induced stacking fault ring to the central axis.

6. The method of producing a single crystalline silicon ingot according to claim 1, wherein the micro-vacancy defect area is equal to or longer than 10% of the body length.

7. The method of producing a single crystalline silicon ingot according to claim 1, wherein the micro-vacancy defect area is equal to or longer than 20% of the body length.

8. The method of producing a single crystalline silicon ingot according to claim 1, wherein the micro-vacancy defect area is equal to or longer than 30% of the body length.

9. The method of producing a single crystalline silicon ingot according to claim 1, wherein the micro-vacancy defect area is equal to or longer than 40% of the body length.

10. The method of producing a single crystalline silicon ingot according to claim 1, wherein initial oxygen concentration of the ingot is under 12 ppma.

11. The method of producing a single crystalline silicon ingot according to claim 1, wherein initial oxygen concentration of the ingot is under 8 ppma.

12. The method of producing a single crystalline silicon ingot according to claim 1, wherein an average value of the axial temperature gradient at the central part is equal to or greater than 30 K/cm and an average value of the axial temperature gradient at the circumferential part is equal to or greater than 40 K/cm when temperature of the ingot ranges from 1120° C. to 1070° C.

13. The method of producing a single crystalline silicon ingot according to claim 1, wherein an average value of the axial temperature gradient at the central part is equal to or greater than 20 K/cm and an average value of the axial temperature gradient at the circumferential part is equal to or greater than 23 K/cm when temperature of the ingot ranges from 1070° C. to 800° C.

* * * * *